(12) United States Patent
Kaneko et al.

(10) Patent No.: US 7,527,869 B2
(45) Date of Patent: May 5, 2009

(54) SINGLE CRYSTAL SILICON CARBIDE AND METHOD FOR PRODUCING THE SAME

(75) Inventors: Tadaaki Kaneko, Sanda (JP); Yasushi Asaoka, Sanda (JP); Naokatsu Sano, Sanda (JP)

(73) Assignee: Kwansei Gakuin Educational Foundation, Hyogo (JP)

( * ) Notice: Subject to any disclaimer, the term of this patent is extended or adjusted under 35 U.S.C. 154(b) by 70 days.

(21) Appl. No.: 10/479,614

(22) PCT Filed: Jun. 4, 2001

(86) PCT No.: PCT/JP01/04708

§ 371 (c)(1),
(2), (4) Date: Jun. 30, 2004

(87) PCT Pub. No.: WO02/099169

PCT Pub. Date: Dec. 12, 2002

(65) Prior Publication Data

US 2004/0237879 A1      Dec. 2, 2004

(51) Int. Cl.
*B32B 9/00* (2006.01)
(52) U.S. Cl. .................. 428/446; 428/698; 117/84
(58) Field of Classification Search .......... None
See application file for complete search history.

(56) References Cited

U.S. PATENT DOCUMENTS 3,527,626 A * 9/1970 Brander ............... 148/33.4
5,719,409 A * 2/1998 Singh et al. .............. 257/77
5,895,526 A * 4/1999 Kitoh et al. ............... 117/84
6,153,166 A   11/2000 Tanino

FOREIGN PATENT DOCUMENTS

| EP | 0 926 271 A1 | 6/1999 |
|---|---|---|
| EP | 0 967 304 A1 | 12/1999 |
| EP | 1 215 730 A1 | 6/2002 |
| EP | 1 243 674 A1 | 9/2002 |
| EP | 1 249 521 A1 | 10/2002 |
| JP | 11-315000 | * 11/1999 |

(Continued)

OTHER PUBLICATIONS

International Conference Silicon Carbide and Related Materials 2007 (ICSCRM2007), "100 mm 4H-SiC Wafers with Zero Micropipe Density, and low 1c-screw Dislocation Density".

(Continued)

*Primary Examiner*—Timothy M Speer
(74) *Attorney, Agent, or Firm*—Oblon, Spivak, McClelland, Maier & Neustadt, P.C.

(57) ABSTRACT

The invention is a high-temperature liquid phase growth method using a very thin Si melt layer and characterized in that there is no need of strict temperature difference control between the growing crystal surface and a raw material supply polycrystal, and control of impurity addition is possible. The grown single crystal SiC is characterized in that no fine grain boundaries exist therein, the density of micropipe defects in the growth surface is $1/cm^2$ or less, and the crystal has a terrace of 10 micrometer or more and a multi-molecular layer step as the minimum unit of a three-molecular layer.

4 Claims, 7 Drawing Sheets

FOREIGN PATENT DOCUMENTS

| | | |
|---|---|---|
| JP | 2001-158695 | 6/2001 |
| JP | 2002-047100 | 2/2002 |
| JP | 3541789 | 4/2004 |

OTHER PUBLICATIONS

Nakamura et al., Nature, "Ultrahigh-quality silicon carbide single crystals", vol. 430, Aug. 26, 2004, pp. 1009-1012.

Ha et al., Journal of Crystal Growth 244 (2002) pp. 257-266, "Dislocation conversion in 4H silicon carbide epitaxy".

R. Yakimova, et al, "Current Status and Advances in the Growth of SIC", Diamond and Related Materials, Elsevier Science Publishers, Amsterdam, NL, vol. 9, No. 3-6, Apr. 2000, pp. 432-438.

Michael Shur et al., "SiC Materials and Devices", vol. 2, World Scientific, Selected Topics in Electronics and Systems—vol. 43, pp. 1-27.

Adrian Powell et al., "Growth of SiC Substrates", World Scientific, International Journal of High Speed Electronics and Systems, vol. 16, No. 3 (2006) 751-777, pp. 1-27.

* cited by examiner

SINGLE CRYSTAL SILICON CARBIDE AND METHOD FOR PRODUCING THE SAME

TECHNICAL FIELD

The present invention relates to single crystal silicon carbide, more specifically, to single crystal silicon carbide used in broad fields as semiconductor devices such as light-emitting diodes, power devices, high-frequency devices, and environment-resistant devices.

BACKGROUND ART

Silicon carbide (hereinafter referred to as SiC) is superior in heat resistance and mechanical strength, besides it has good resistance to radiation. Further, it is easy to perform valence control of electrons and holes by doping with impurities. Furthermore, SiC has a wide band gap, for example, single crystal 6H—SiC has a band gap of about 3.0 eV and single crystal 4H—SiC has a band gap of 3.3 eV. Therefore, it is possible to realize high temperature, high frequency, withstand voltage, and environmental resistance properties, which can not be realized by any existing semiconductor material such as silicon (hereinafter referred to as Si) and gallium arsenide (hereinafter referred to as GaAs). SiC attracts attention and is expected as a semiconductor material for next-generation power devices and high-frequency devices. On the other hand, hexagonal SiC has a lattice constant close to that of gallium nitride (hereinafter referred to as GaN) and is expected as a substrate for GaN.

Conventionally, single crystal SiC of this type is produced by a sublimation and recrystallization method (modified Lely method) in which a seed crystal is fixedly placed on the lower-temperature side in a graphite crucible and SiC powder as a raw material is inserted in the higher-temperature side, and then the interior of the graphite crucible is heated to a high temperature of 1450 to 2400 degrees C. in an inert atmosphere, and thereby the SiC powder is sublimated and recrystallized on a surface of the seed crystal on the lower-temperature side to grow a single crystal. Otherwise, single crystal SiC is produced by an liquid phase epitaxial growth method (hereinafter referred to as LPE method) in which Si melt is put in a crucible containing carbon (hereinafter referred to as C) atoms, and then the Si melt is heated to the crystal growth temperature by heating the crucible and a single crystal SiC substrate supported by a holder or the like is dipped in a low-temperature region in the Si melt for a certain time, and thereby C as a constituent element of the crucible is dissolved in the Si melt and single crystal SiC produced by reaction between Si and C is epitaxially grown on a surface of the single crystal SiC substrate.

In the above-described conventional growth methods, however, in case of the sublimation and recrystallization method, although the growth rate is very high as several hundreds micrometer/hr, the SiC powder is once decomposed into Si, $SiC_2$, and $Si_2C$ upon sublimation to evaporate, and further they react with part of the graphite crucible. Therefore, gas that reaches the surface of the seed crystal varies in kind in accordance with a change in temperature. It is technically very difficult to stoichiometrically accurately control the partial pressures of them. In addition, impurities are easy to mix in, and crystal defects, micropipe defects, etc., are apt to be generated under the influence of distortion caused by the mixed impurities or heat. Further, there is generation of grain boundaries caused by generation of many nuclei. Thus, there is a problem that single crystal SiC stable in performance and quality can not be obtained.

On the other hand, in case of the LPE method, there is less generation of micropipe defects, crystal defects, etc., as observed in the sublimation and recrystallization method, and single crystal SiC is obtained that is superior in quality in comparison with that produced by the sublimation and recrystallization method. However, as shown with black triangular marks in FIG. 6, the growth rate is very low as 10 micrometer/hr or less because the rate of the growth process is influenced by the solubility of C in the Si melt. Therefore, the productivity of single crystal SiC is low and the temperature of the liquid phase in the production apparatus must be accurately controlled. In addition, the production process is complicated and the production cost of single crystal SiC is very high. A method of mixing transition metal such as Sc in the Si melt may be adopted so that the solubility of C in the Si melt is increased to promote the growth rate. In this case, however, because the transition metal is taken in the growing crystal as impurities, the purity is deteriorated. Thus, single crystal SiC fully satisfactory in quality and performance can not be obtained. In the growth process, as shown with square marks in FIG. 6, the solubility of C in the Si melt is increased by mixing Sc in. However, there is a problem that the productivity of single crystal SiC is very low in comparison with the sublimation and recrystallization method.

The present invention has been made in view of the above-described problems and aims to provide high-quality, high-performance single crystal SiC in which generation of micropipe defects, interface defects, etc., is less and which has a broad terrace and high surface flatness.

DISCLOSURE OF THE INVENTION

Single crystal SiC according to the present invention is single crystal SiC formed by a liquid phase epitaxial method by forming a very thin Si melt layer in a local region, i.e., at the interface between a monocrystal substrate and a polycrystal substrate, and characterized in that there are no fine grain boundaries and the density of micropipe defects in a surface is not more than $1/cm^2$.

Because there are no fine grain boundaries in the growth crystal and the density of micropipe defects in a surface is not more than $1/cm^2$, it is possible to efficiently use formed single crystal SiC, and application as various semiconductor devices is possible. Micropipe defects are also called pin holes, which are tubular spaces each having a diameter of several micrometer or less and extending along the growth direction of the crystal.

In single crystal SiC according to the present invention, said surface has an atomic order step as the minimum unit of a three-molecular layer, and a broad terrace, and a width of said terrace is not less than 10 micrometer.

Because the width of the terrace is not less than 10 micrometer, there is no need of surface treatment by mechanical processing or the like. Therefore, it is possible to make a production not through any processing step.

In single crystal SiC according to the present invention, said surface is a (0001) Si plane.

Because the orientation of the surface is a (0001) Si plane, the surface energy is low in comparison with a (0001) C plane. Therefore, the nucleus formation energy in growth is high and nuclei are hard to form. For the above reason, single crystal SiC having a broad terrace can be obtained after liquid phase growth.

Single crystal SiC according to the present invention is liquid-phase-epitaxially grown on a single crystal SiC substrate in a state wherein said single crystal SiC substrate as a seed crystal and a polycrystal SiC substrate are piled up, they are put in a closed container made of graphite, high-temperature heat treatment is then performed to interpose metallic Si melt between said single crystal SiC substrate and said polycrystal SiC substrate, and an evaporation part of said melt itself and a difference quantity between an amount of Si fed from said polycrystal SiC substrate and Si consumption consumed in epitaxial growth of single crystal SiC are supplied from a Si source separately placed.

Upon heat treatment, by the capillary phenomenon, wetness of Si permeates anywhere in the interface between the single crystal SiC substrate and the polycrystal SiC substrate to form a very thin metallic Si melt layer. C atoms having flown out of the polycrystal SiC substrate are supplied to the single crystal SiC substrate through the Si melt layer to liquid-phase-epitaxially grow as single crystal SiC on the single crystal SiC substrate. Therefore, induction of defects can be suppressed from the beginning to the end of the growth. In addition, because there is no need of treatment by dipping in melted Si as in a conventional method, the amount of removal of Si melted and having adhered to the single crystal SiC substrate as a seed crystal and the polycrystal SiC substrate is very little.

In addition, because the very thin metallic Si melt layer is interposed between the single crystal SiC substrate and the polycrystal SiC substrate upon heat treatment, only metallic Si necessary for epitaxial growth of single crystal SiC can be used for liquid phase epitaxial growth of single crystal SiC. Therefore, in the thin Si layer upon heat treatment, the contact area with the exterior is the minimum. Thus, the possibility of entrance of impurities is reduced and highly pure single crystal SiC can be formed.

In addition, because the very thin metallic silicon melt layer is interposed with supplying a Si source, the thickness of formed single crystal SiC can be controlled into a prescribed thickness.

In single crystal SiC according to the present invention, a thickness of said very thin metallic silicon melt layer is not more than 50 micrometer.

Because the very thin metallic Si melt layer interposed between the single crystal SiC substrate and the polycrystal SiC substrate upon heat treatment is 50 micrometer or less, preferably, 30 micrometer or less, C dissolved from the polycrystal SiC substrate is transported by diffusion onto the surface of the single crystal SiC substrate to promote the growth of single crystal SiC. If the thickness of said very thin metallic silicon melt layer is 50 micrometer or more, the metallic silicon melt layer is unstable, and transportation of C is hindered. This is unsuitable for the growth of single crystal SiC according to the present invention.

In single crystal SiC according to the present invention, there is formed no temperature difference between said single crystal SiC substrate and said polycrystal SiC substrate upon said high-temperature heat treatment.

Because there is formed no temperature difference between the single crystal SiC substrate and the polycrystal SiC substrate, heat treatment can be performed in a thermal equilibrium condition. In addition, because the metallic melt layer is thin, heat convection is suppressed. Further, because formation of nuclei is suppressed upon heat treatment, generation of fine grain boundaries in the formed single crystal SiC can be suppressed. In addition, a simple heat treat apparatus can be used. Besides, because there is no need of strict temperature control upon heating, remarkable reduction of manufacture cost can be made.

Single crystal SiC according to the present invention is usable as a single crystal SiC body and a surface epitaxial growth layer of single crystal SiC.

Because single crystal SiC having an arbitrary thickness can be formed, application to a single crystal SiC body and a surface epitaxial growth layer is possible.

In single crystal SiC according to the present invention, a group III metal is added so that the conductivity is controlled into p-type.

By adding aluminum (hereinafter referred to as Al) or boron (hereinafter referred to as B) as group III metal, or a gaseous compound containing it, for example, trimetylaluminum (hereinafter referred to as TMAl), triethylaluminum (hereinafter referred to as TEAl), $B_2H_6$, etc., the conductivity of the formed single crystal SiC can be controlled into p-type.

In single crystal SiC according to the present invention, a group V element is added so that the conductivity is controlled into n-type.

By adding nitrogen (hereinafter referred to as N) as a group V element, the conductivity of single crystal SiC can be controlled into n-type. As a method for adding, upon heat treatment, $N_2$ gas is introduced into the closed container made of graphite. Otherwise, silicon nitride (hereinafter referred to as $Si_3N_4$) is placed together with Si within the closed container made of graphite. An arbitrary method can be adopted.

In a method for producing single crystal silicon carbide, wherein a single crystal silicon carbide substrate as a seed crystal and a polycrystal silicon carbide substrate are piled up, very thin metallic Si melt layer is interposed between said single crystal silicon carbide substrate and said polycrystal silicon carbide substrate, they are placed in a closed container made of graphite, and high-temperature heat treatment is then performed with supplying, from a Si source separately placed, an evaporation part of the melt itself and a difference part of the amount of Si fed from the polycrystal SiC substrate from Si consumed in epitaxial growth of single crystal SiC so that single crystal silicon carbide is liquid-phase-epitaxially grown on said single crystal silicon carbide substrate.

By this method, because there is no need of treatment by dipping in melted Si, there is no permeation of excessive Si between the single crystal SiC substrate and the polycrystal SiC substrate.

In addition, by this method, entrance of impurities upon heat treatment can be suppressed and highly pure single crystal SiC can be formed. In addition, by separately supplying the Si source for liquid phase epitaxial growth of single crystal SiC, evaporation of very thin metallic Si can be suppressed to form single crystal SiC having an arbitrary thickness.

In the production of single crystal SiC according to the present invention, in the used single crystal SiC substrate as a seed crystal, a (0001) Si plane of 6H—SiC is preferably used. In addition, the polycrystal SiC substrate preferably has a mean grain size of 5 micrometer to 10 micrometer and it is preferably substantially even in grain size. Thus, the crystal structure of the polycrystal SiC substrate is not particularly limited and any of 3C–SiC, 4H–SiC, and 6H–SiC can be used.

In the method for producing single crystal silicon carbide according to the present invention, a group III metal is added in one or both of said polycrystal SiC substrate and very thin metallic Si melt layer so that the conductivity of single crystal SiC liquid-phase-epitaxially grown on said single crystal SiC substrate is controlled into p-type.

Upon heat treatment, a gaseous compound containing Al, B, or the like, as a group III metal, for example, TMAl, TEAl, $B_2H_6$, or the like, is supplied into the closed container made of graphite. Or, by beforehand adding Al, B, or the like, as a group III metal, in one or both of the polycrystal SiC substrate or very thin metallic Si melt layer, the additive is supplied into formed single crystal SiC upon liquid phase epitaxial growth so that the conductivity of the single crystal SiC can be controlled.

In the method for producing single crystal silicon carbide according to the present invention, a group V element is added in one or both of said polycrystal SiC substrate and very thin metallic Si melt layer so that the conductivity of single crystal SiC liquid-phase-epitaxially grown on said single crystal SiC substrate is controlled into n-type.

By supplying $Si_3N_4$ or $N_2$ gas as a group V element or a gaseous compound containing a group V element, upon heat treatment together with a Si source, the conductivity of single crystal SiC can be controlled into n-type.

Thus, by adequately selecting a group III metal or a gaseous compound containing a group III metal, or a group V element or a gaseous compound containing a group V element, as an additive to be added upon high-temperature heat treatment, the conductivity of single crystal SiC can be controlled into p- or n-type.

BRIEF DESCRIPTION OF DRAWINGS

In FIGS. 4, (a) is an AFM image of the surface morphology and (b) is an AFM image showing its section.

In FIGS. 7, (a) is a graph showing the measurement results and (b) is a diagram showing the energy levels.

BEST FORM FOR CARRYING OUT THE INVENTION

Hereinafter, single crystal SiC according to the present invention will be described with reference to FIGS. 1 and 2 using examples different in manner of interposing very thin metallic Si melt between monocrystal and polycrystal SiC substrates.

Hereinafter, single crystal SiC according to the present invention will be described with reference to FIGS. 1 and 2 using examples different in manner of interposing very thin metallic Si melt layer between single crystal and polycrystal SiC substrates.

Figure 1:
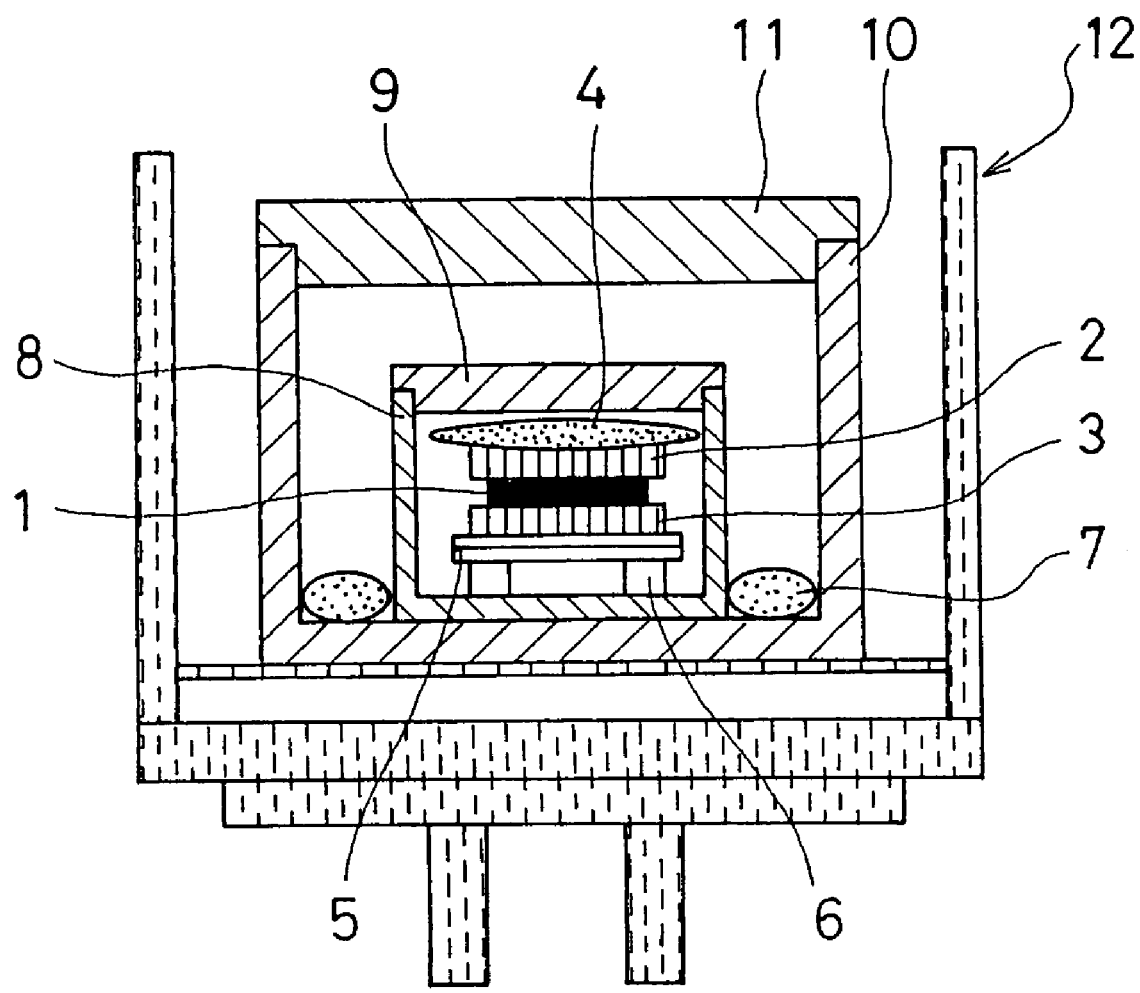
FIG. 1 is a sectional view illustrating an example of a heat treat furnace used in a producing method of single crystal SiC according to the present invention.

FIG. 1 is a schematic sectional view of a heat treat furnace used for growing single crystal SiC according to the present invention. In FIG. 1, reference numeral 1 denotes a single crystal 6H—SiC substrate as a seed crystal. Reference numerals 2 and 3 denote polycrystal SiC substrates sandwiching the single crystal SiC substrate 1. Reference numeral 4 denotes metallic Si. Reference numeral 7 denotes a Si piece for controlling sublimation of SiC upon heat treatment. Reference numeral 10 denotes a crucible made of graphite. Reference numeral 11 denotes an upper cover. Reference numeral 12 denotes a soaking case.

As illustrated in FIG. 1, the single crystal SiC substrate 1, polycrystal SiC substrates 2 and 3, and metallic Si 4 are put on a SiC ring 6 with an interposed graphite sheet 5. They are accommodated in a hermetic closed container constructed by an upper cover 9 and a crucible 8 each made of graphite. The single crystal SiC substrate 1 was cut out into a desired size of 10 multiplied by 10 to 20 multiplied by 20 mm from a wafer of single crystal 6H—SiC made by a sublimation method. As the polycrystal SiC substrates 2 and 3 usable are those cut out into a prescribed size from SiC used as a dummy wafer in a manufacturing process of a Si semiconductor made by a CVD method. The surface of each of the substrates 1, 2, and 3 has been polished into a mirror surface, and oils, oxide films, metals, etc., having adhered to the surface have been removed by washing or the like. The lower polycrystal SiC substrate 3 is for preventing the single crystal SiC substrate 1 from being eroded from the graphite crucible 8. It contributes an improvement in quality of single crystal SiC that is LPE-grown on the single crystal SiC substrate 1.

Further, the graphite crucible 8 is placed within the graphite crucible 10 together with Si pieces 7 for controlling sublimation of SiC and evaporation of Si upon heat treatment. The Si pieces 7 are sublimated upon heat treatment to increase the partial pressure of SiC and the partial pressure of Si in the graphite crucible 10. They contribute prevention of sublimation of the single crystal SiC substrate 1, polycrystal SiC substrates 2 and 3, and very thin metallic Si placed within the graphite crucible 8. The graphite crucible 10 is sealed with the upper cover 11 made of graphite, and then placed within the soaking case 12. It is accommodated within the heat treat furnace to suffer heat treatment. In the heat treat furnace of this embodiment, because there is no need of formation of temperature difference between the single crystal SiC substrate 1 and the polycrystal SiC substrates 2 and 3, no accurate temperature control in the furnace is required. Any of a high-frequency furnace, a resistance superheating furnace, etc., can be used. Thus, the form of the treat furnace is not particularly limited.

After the gas in the furnace is replaced by reducing gas, heat treatment is performed in the reducing gas atmosphere. The temperature of heat treatment suffices if the metallic Si 4 can be melted at the temperature. It is 1450 degrees C. or more, preferably, 2000 to 2300 degrees C. As the treatment temperature increases, the wettability between melted Si and SiC is more improved and the melted Si becomes easy to permeate between the single crystal SiC substrate 1 and the polycrystal SiC substrate 2 by the capillary phenomenon. Thus, very thin metallic Si melt layer having a thickness of 50 micrometer or less can be interposed between the single crystal SiC substrate 1 and the polycrystal SiC substrate 2. The treatment time can be adequately selected such that the produced single crystal SiC has a desired thickness. If a large amount of metallic Si 4 is placed on the polycrystal SiC substrate 2, the quantity of the metallic Si 4 melted upon heat treatment increases. If the thickness of the metallic Si melt is 50 micrometer or more, the metallic Si melt becomes unstable, and transportation of C. is hindered. It is unsuitable for growth of single crystal SiC according to the present invention. In addition, Si unnecessary for formation of single crystal SiC is melted and collected in the bottom portion of the graphite crucible 8, and there arises necessity for removing metallic Si having solidified again after formation of single crystal SiC. Therefore, the size and thickness of the metallic Si 4 are adequately selected in accordance with the size of single crystal SiC to be formed. As will be described later, in case of increasing the thickness of single crystal SiC to be formed, separate metallic Si as a supply source of Si in the graphite crucible 8 can be provided in a graphite crucible or the like, which is accommodated within the graphite crucible 8 to suffer heat treatment.

The growth mechanism of single crystal SiC will be described in brief. Attendant upon heat treatment, melted Si permeates between the single crystal SiC substrate 1 and the upper polycrystal SiC substrate 2 to form a Si melt layer having a thickness of about 30 micrometer to 50 micrometer at the interface between both substrates 1 and 2. The Si melt layer becomes thinner to about 30 micrometer as the temperature of heat treatment increases. C atoms flowing out of the polycrystal SiC substrate 2 are supplied to the single crystal SiC substrate 1 through the Si melt layer, so that single crystal 6H—SiC grows on the single crystal SiC substrate 1 by the liquid phase epitaxial growth (hereinafter referred to as LPE). Because the interval between the single crystal SiC substrate 1 as a seed crystal and the polycrystal SiC substrate 2 is thus narrow, there is generated no heat convection upon heat treatment. Therefore, the interface between formed single crystal SiC and the single crystal SiC substrate 1 as a seed crystal is very smooth, and distortion or the like is not formed in the interface. Thus, very smooth single crystal SiC is formed. In addition, because generation of nuclei of SiC is suppressed upon heat treatment, generation of fine grain boundaries in formed single crystal SiC can be suppressed. In the growth method of single crystal SiC according to this embodiment, because melted Si permeates only between the single crystal SiC substrate 1 and the polycrystal SiC substrate 2, no other impurities permeate in growing single crystal SiC. Thus, highly pure single crystal SiC can be produced.

Figure 2:
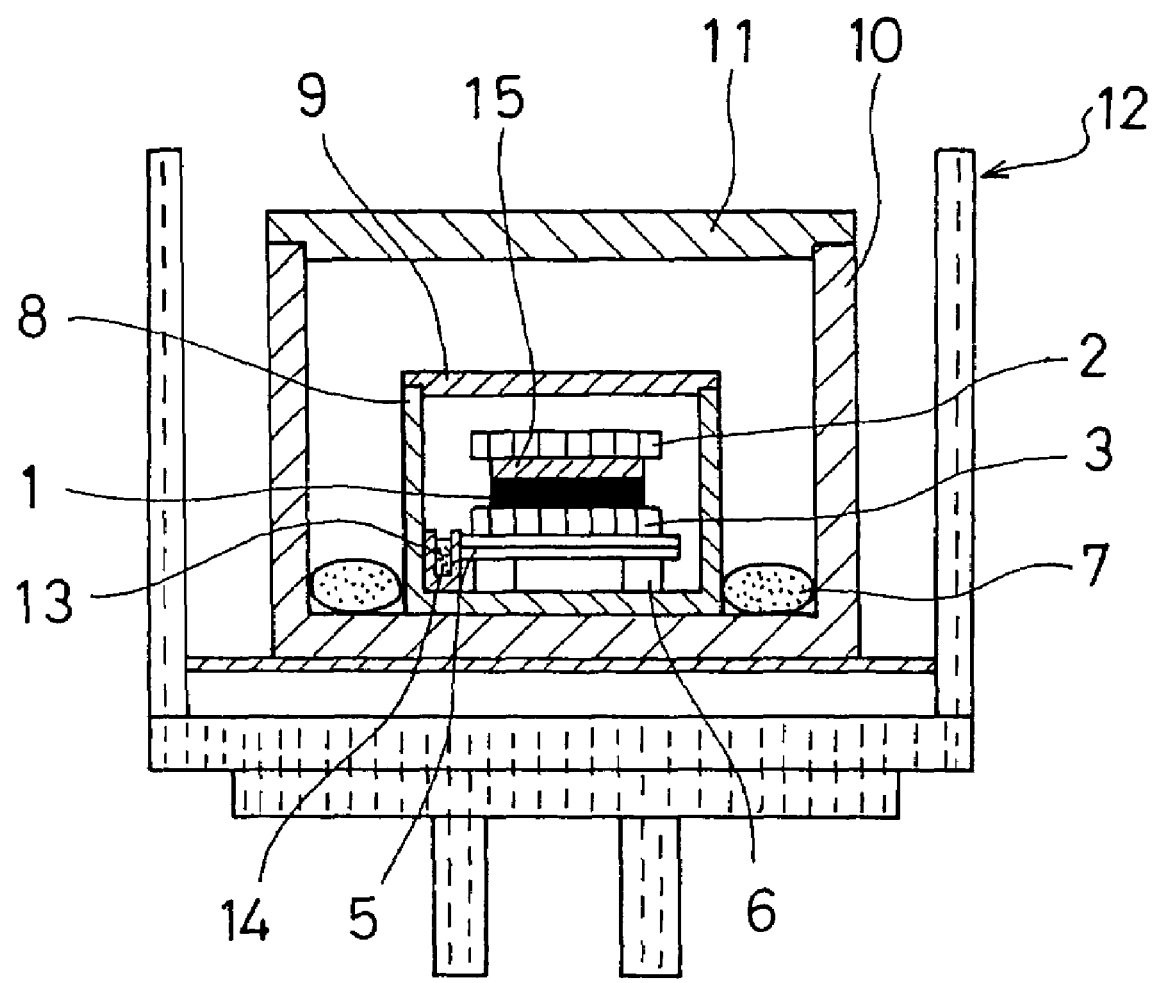
FIG. 2 is a sectional view illustrating a heat treat furnace for explaining an example of another producing method of single crystal SiC according to the present invention.

On the other hand, as the method of interposing very thin metallic Si melt layer between the single crystal SiC substrate 1 and the polycrystal SiC substrate 2, the method illustrated in FIG. 2 is also possible. In FIG. 2, the same components as in FIG. 1 are denoted by the same reference numerals as in FIG. 1 and the detailed description thereof is omitted.

As illustrated in FIG. 2, metallic Si 15 having a thickness of about 30 micrometer to 50 micrometer is interposed in advance on the surface of the single crystal SiC substrate 1 as a seed crystal. As a method of interposing, a film may be formed on the surface of the single crystal SiC substrate 1 by CVD or the like, or Si powder may be put on the surface. The method is not particularly limited. In addition, a graphite crucible 13 charged with metallic Si 14 is accommodated in the graphite crucible 8. The amount of metallic Si 14 is adequately controlled such that formed single crystal SiC has a desired thickness.

As illustrated in FIG. 2, because metallic Si 15 having a thickness of about 30 micrometer to 50 micrometer is interposed in advance on the surface of the single crystal SiC substrate 1 as a seed crystal, by heat treatment of 1450 degrees C or more, preferably, 2000 to 2300 degrees C., the wettability between the metallic Si interposed in advance and the single crystal SiC substrate 1 is improved, and single crystal SiC is formed on the single crystal SiC substrate 1. In this embodiment, because metallic Si 14 as a Si supply source is separately accommodated within the graphite crucible 8, the metallic Si 14 evaporates upon heat treatment and permeates between the polycrystal SiC substrate 2 and formed single crystal SiC to supplement evaporation of Si melt and work as a new Si source for growth of single crystal SiC. Thus, because the temperature of heat treatment is controlled and a Si source for growth of single crystal SiC is separately supplied, the thickness of single crystal SiC can be controlled by keeping very thin metallic Si melt layer for a long time. This makes it possible to freely produce from an epitaxial growth layer of single crystal SiC to a bulk body of single crystal SiC. As a Si supply source, other than the method of accommodating separate metallic Si within the same graphite crucible as in this embodiment, it is also possible to externally supply Si-base gas. Besides, as a Si supply source, as illustrated in FIG. 1 as described above, metallic Si can be put on the polycrystal SiC substrate 2.

Figure 3:
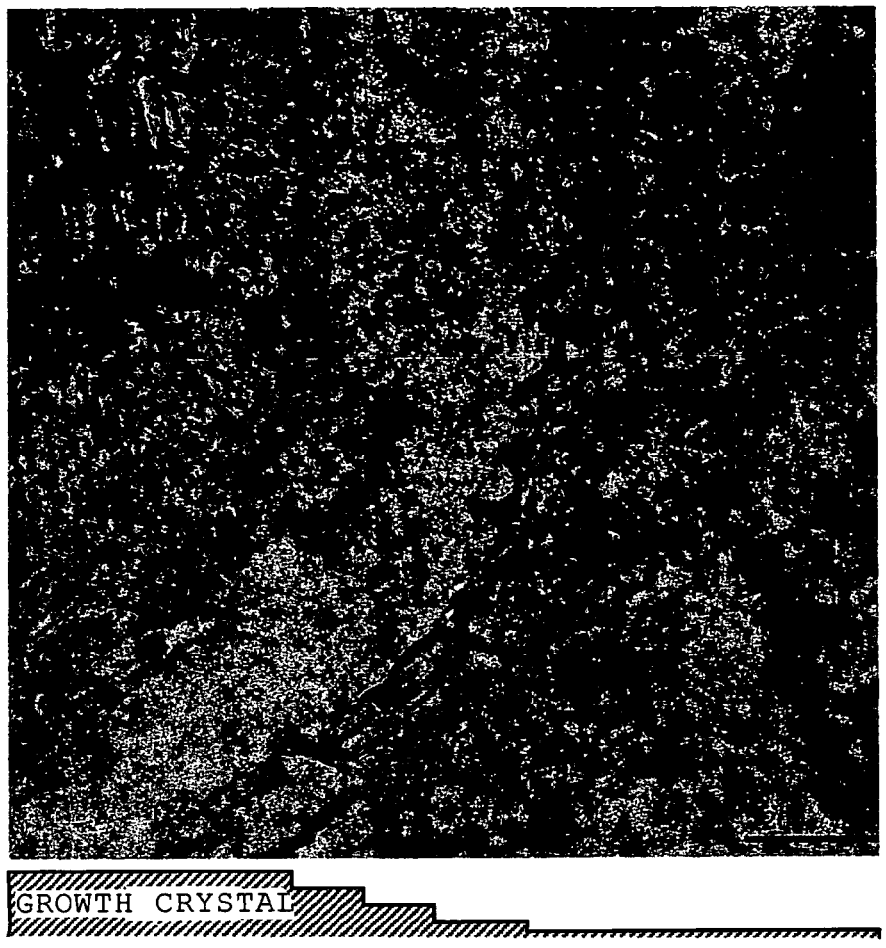
FIGS. 3 are microphotographs of a surface of a growth layer of single crystal SiC according to this embodiment. (a) is a microphotograph showing the surface morphology and (b) is a microphotograph showing its section.
Figure 3:
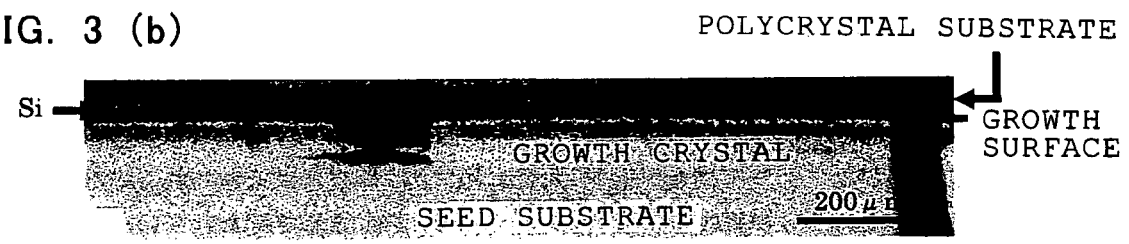

FIG. 3 are microphotographs showing a surface condition of single crystal SiC grown by the above-described method. In FIG. 3, (*a*) is a microphotograph showing the surface morphology and (*b*) is a microphotograph showing its section. As shown in FIG. 3, in the growth surface of the crystal by the LPE method, a very flat terrace and a step structure are observed.

Figure 4:
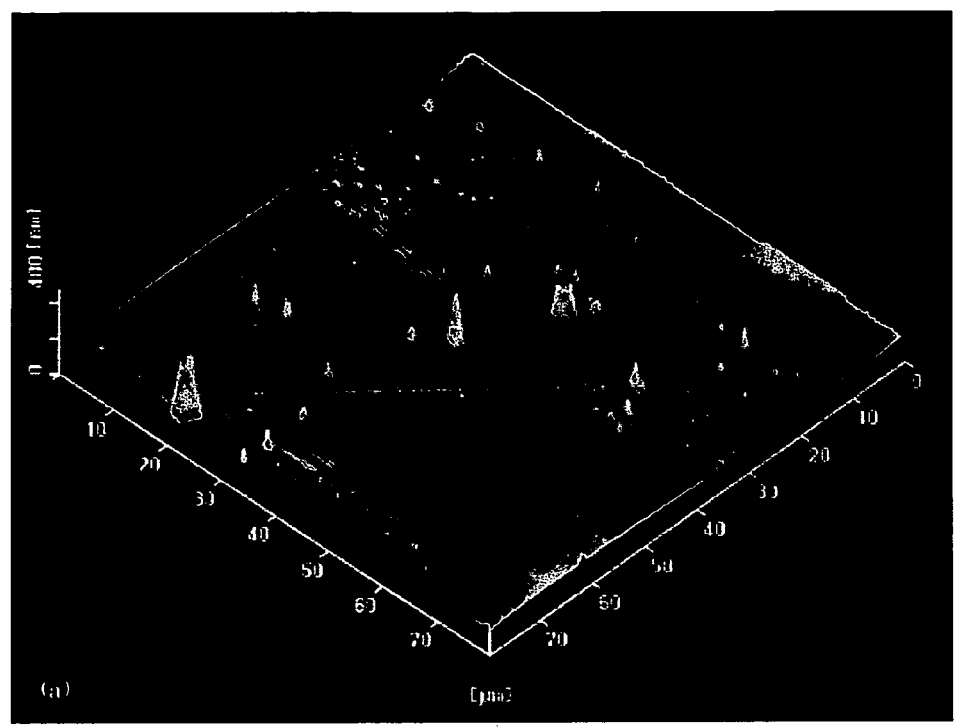
FIGS. 4 are AFM images of a surface of single crystal SiC illustrated in FIG. 3.
Figure 4:
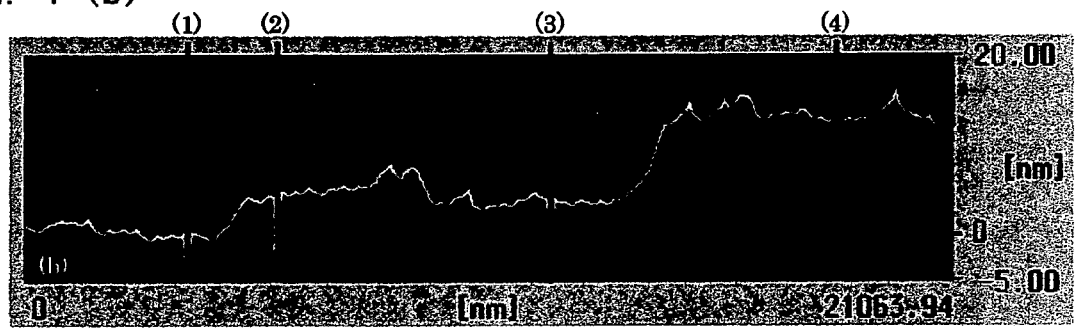

FIG. 4 show results of observing the surface with an atomic force microscope (hereinafter referred to as AFM). As observed in FIG. 4, it is understood that the heights of steps are 4.0 nm and 8.4 nm, respectively. These are integral times the height of a three-molecular layer of a SiC molecule, one-molecular layer of which has a height of 0.25 nm. Thus, it is understood that the surface is very flat.

In addition, as understood also from the microphotograph of the surface morphology in FIGS. 3, no micropipe defects are observed in the surface. From these, in single crystal SiC according to the present invention, it is understood that the density of micropipe defects formed in the surface is very low as $1/cm^2$ or less, the width of the terrace formed in the surface is large as 10 micrometer or more, and the terrace is flat and has less defects.

Figure 5:
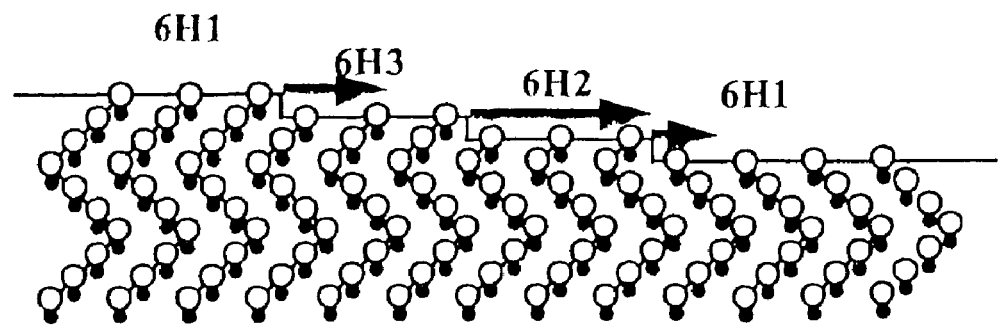
FIGS. 5 are views for explaining the step-bunching mechanism in the growth process of single crystal SiC according to this embodiment.
Figure 5:
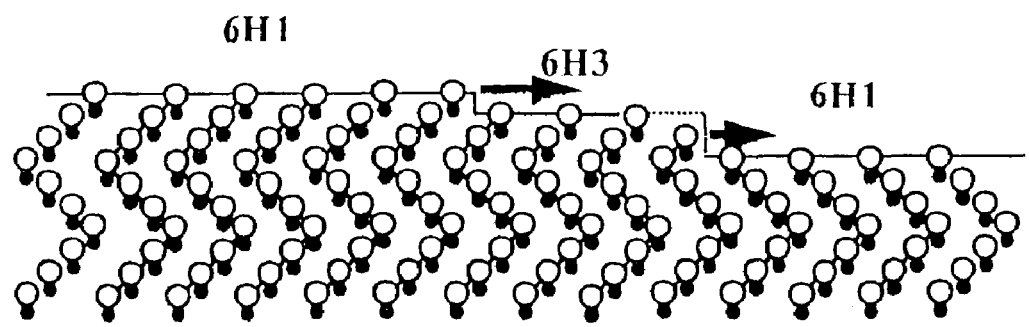
Figure 5:
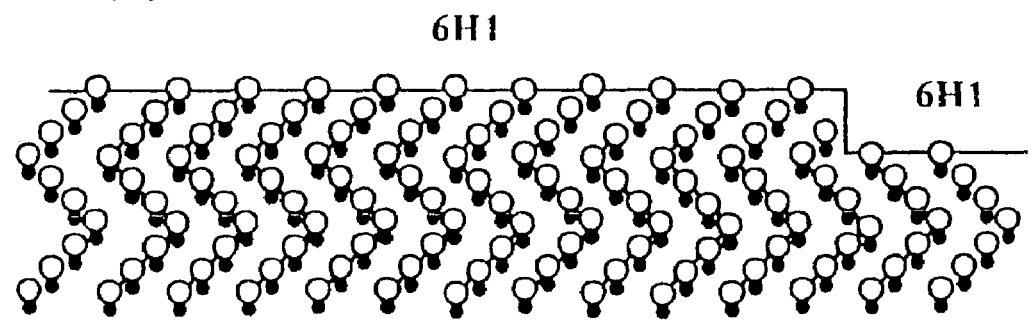

In general, epitaxial growth of a crystal progresses one-molecular layer by one-molecular layer. In single crystal SiC according this embodiment, however, its surface is constituted by a broad terrace of 10 micrometer or more and steps each having a height as the minimum unit of a three-molecular layer. From this, it is thinkable that step bunching occurs in the process of crystal growth. The step-bunching mechanism can be explained by the effect of surface free energy in crystal growth. In single crystal 6H—SiC according to this embodiment, there are two kinds of layer period directions of ABC and ACB in a unit layer period. Therefore, by numbering the layers as 1, 2, and 3 from each layer at which the layered direction changes, three kinds of surfaces can be defined as illustrated in FIG. 5. The energy of each surface has been obtained as follows (T. Kimoto et al., J. Appl. Phys. 81 (1997) 3494-3500):

6H1=1.33 meV
6H2=6.56 meV
6H3=2.34 meV.

Because the energy thus varies from surface to surface, the rate of the terrace expansion varies. That is, the higher the surface free energy of the surface is, the higher the rate of the growth of the terrace is. Thus, as illustrated in FIGS. 5(*a*), (*b*), and (*c*), step bunching occurs in each three periods. In addition, in this embodiment, it is thinkable that the number of dangling bonds exposed from the step surface varies step by step due to the difference in layer period, i.e., ABC or ACB, and step bunching further occurs in a unit of three molecules due to the difference in the number of dangling bonds exposed from the step end. It is thinkable that the advancing rate of one step is low at where one dangling bond is exposed from the step, and high at where two dangling bonds are exposed. Thus, in 6H—SiC, it is thinkable that step bunching progresses in a unit of height semi-integral times the lattice constant, and after growth, the surface of single crystal SiC is covered with steps each having the minimum unit of a three-molecular layer and a flat terrace.

As described above, in single crystal SiC according to this embodiment, its terrace is formed by step bunching. Therefore, steps are formed to be concentrated in the vicinity of an end of single crystal SiC. In FIGS. 3 and 4 as described above, an end portion of single crystal SiC was observed for observing the step portions.

In addition, in single crystal SiC in this embodiment, the growth temperature is very high as 2000 degrees C. in comparison with the growth temperature of conventional single crystal SiC. As the growth temperature is raised, the solubility of C in Si melt formed between the single crystal SiC as a seed crystal and the polycrystal SiC increases. In addition, it is thinkable that the diffusion of C in the Si melt increases as the temperature is raised. Because the supply source of C and the seed crystal are thus very close to each other, a high growth rate as 500 micrometer/hr can be realized as shown with black circular marks in FIG. 6.

Figure 6:
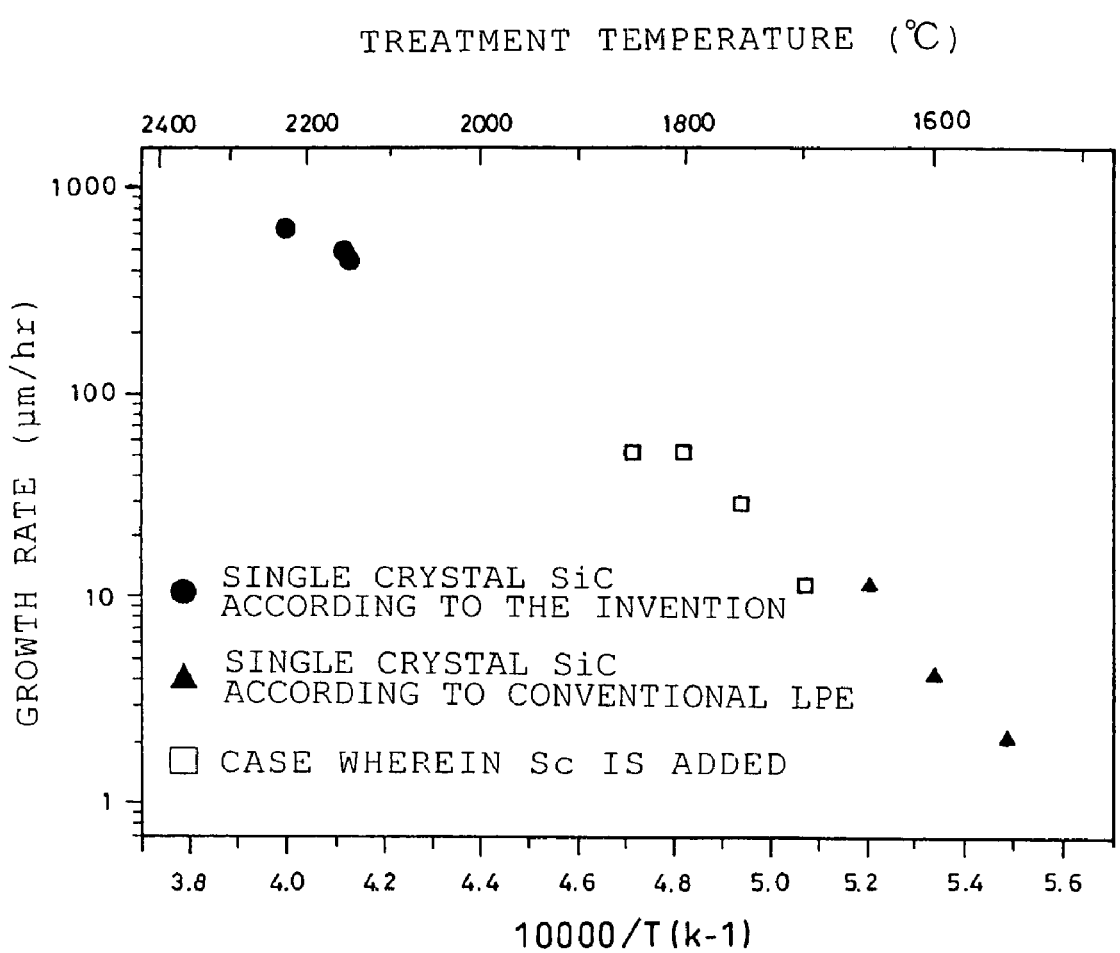
FIG. 6 is a graph showing a comparison in growth rate between single crystal SiC according to the present invention and single crystal SiC according to conventional LPE methods.

From FIG. 6, it is understood that there is a tendency that the growth rate can be approximated with a straight line in the whole temperature range. In the tendency, however, it is understood that the gradient in the higher-temperature portion is gentler than that in the lower-temperature portion. In addition, it has been reported that the activation energy of the growth rate varies in accordance with the disposition direction of the seed substrate. Thus, in the solution growth of SiC, a large number of factors, i.e., the diffusion process of C in Si melt, the diffusion process of C in the substrate surface, the desolvation process of C, and the process of being taken in a crystal as SiC, are complicatedly intertwined.

As a growth driving force in solution growth, oversaturation occurs due to the difference between the equilibrium concentration $C_e$ of the crystal at the growth temperature and the concentration $C_S$ of the melt on the crystal surface, and the crystal growth progresses. In melt growth of SiC, in general, oversaturation is produced by setting the seed substrate at a low temperature to make Ce lower than the raw material as a supply source of C. In the present invention, however, because no temperature difference is made between the single crystal SiC substrate as a seed crystal and the polycrystal SiC substrate as a supply source of C, the growth direction can be independent of temperature difference. Thus, it is understood that the oversaturation degree as a driving force for crystal growth is not given by the temperature difference between the raw material and the growing crystal. Therefore thinkable is the equilibrium concentration in the crystal surface dependent upon difference in polymorph and crystal size. The vapor pressure of SiC varies in accordance with polymorph. The vapor pressure of 3C—SiC is higher than that of 6H—SiC. In addition, decomposition is suppressed in the range of the larger crystal size of a polycrystal. It is thinkable that the quantity of SiC solved in the Si melt varies due to the difference in surface energy caused by the crystal size. Therefore, it is thinkable that the equilibrium concentration $C_3^{6H}$ of 6HSiC and the equilibrium concentration $C_e^{poly}$ of the polycrystal board differs from each other and a relation of:

$$C_e^{6H} \text{ less than } C_{Liquid} \text{ less than } C_e^{poly}$$

is effected, where $C^{Liquid}$ represents the concentration of C in Si melt. The difference between $C_e^{6H}$ and $C_e^{poly}$ generates oversaturation to progress the growth. Therefore, it is thinkable that the oversaturation caused by the difference in equilibrium concentration between the polycrystal and the seed substrate is the growth driving force of single crystal SiC according to this embodiment. Thus, at the growth temperature, it is thinkable that C of the polycrystal SiC substrate is decomposed and dissolved in the Si melt, diffused on the surface of the single crystal SiC substrate as a seed crystal, performs desolvation on the single crystal SiC substrate through surface diffusion, and taken in the crystal.

As described above, in single crystal SiC according to this embodiment, the density of micropipe defects in the surface is 1/cm² or less, and a terrace having a large width of 10 micrometer or more is formed. Therefore, there is required no surface treatment such as mechanical processing after the formation of single crystal SiC. Besides, because there is less crystal defects and the like, it is usable for light-emitting diodes and various semiconductor diodes. In addition, because the growth of the crystal depends upon not temperature but the surface energies of the seed crystal and the crystal of the supply source of C, there is no need of strict temperature control in the treat furnace. This makes it possible to considerably reduce the manufacturing cost. Further, because the interval between the single crystal SiC as a seed crystal and the polycrystal SiC as a supply source of C. is very narrow, heat convection upon heat treatment can be suppressed. Besides, because a temperature difference is hard to be generated between the single crystal SiC as a seed crystal and the polycrystal SiC as a supply source of C, heat treatment can be performed in a thermal equilibrium state.

Although 6H—SiC is used as a seed crystal in this embodiment, 4H—SiC is also usable.

In addition, in single crystal SiC according to the present invention, the size of single crystal SiC to be formed can be controlled by adequately selecting the sizes of the single crystal SiC as a seed crystal and the polycrystal SiC substrate as a supply source of C. In addition, because no distortions are formed between formed single crystal SiC and the seed crystal, single crystal SiC having a very smooth surface can be produced. This makes it possible to apply single crystal SiC according to the present invention to a surface refining film.

Further, by applying heat treatment by the above-described method in a state wherein single crystal SiC as a seed crystal and polycrystal SiC as a supply source of C are alternately piled up or laterally arranged, a large amount of single crystal SiC can be produced at once.

In addition, in a producing method of single crystal SiC according to the present invention, the conductivity of p-type or n-type of the growth crystal can be arbitrarily controlled by beforehand adding impurities of group III metal such as Al or B in the polycrystal SiC substrate and metallic Si, or introducing gas containing an element such as nitrogen, Al, or B in the atmosphere in growth for controlling the conductivity of SiC.

Figure 7:
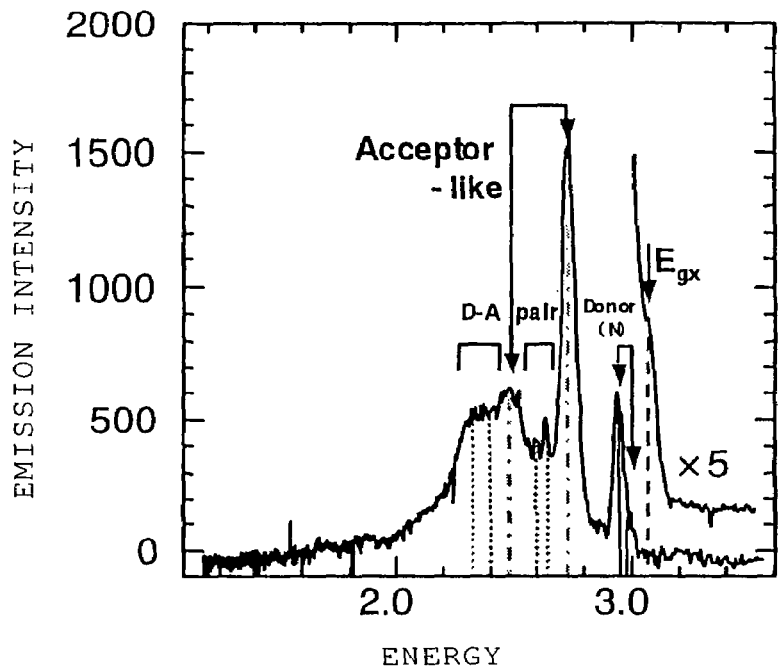
FIGS. 7 show cathode luminescence measurement results of a growth layer of single crystal SiC doped with impurities according to this embodiment.
Figure 7:
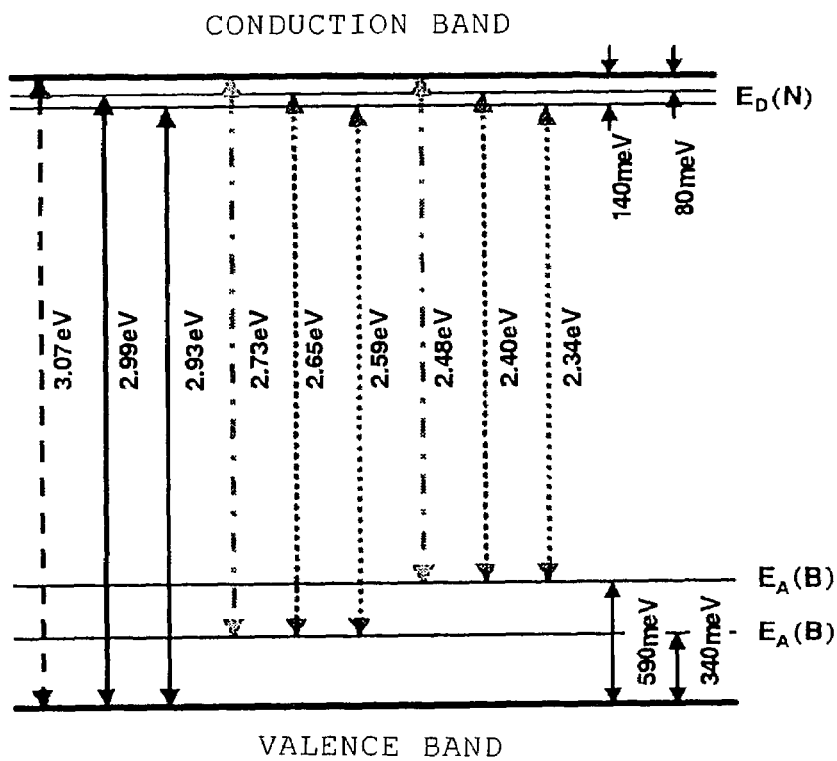

FIGS. 7 show cathode luminescence measurement results of LPE-grown single crystal SiC, using the SiC ring 6 (see FIG. 1), in which B has been added, for supporting the single crystal SiC substrate 1 as a seed crystal and the polycrystal SiC substrates 2 and 3. FIG. 7(a) shows results of measurement of emission spectrum from a growth crystal excited by an electron beam when the electron beam of an acceleration voltage of 25 kV was applied to a surface of single crystal SiC at a measurement temperature of 100 k. FIG. 7(b) is a diagram typically showing band bonding in single crystal SiC for explaining the emission spectrum of FIG. 7(a).

As shown in FIG. 7, in single crystal SiC according to this embodiment, peaks appear at optical energy positions of 3.07 eV, 2.99 eV, 2.93 eV, 2.73 eV, 2.65 eV, 2.59 eV, 2.48 eV, 2.40 eV, and 2.34 eV. In other words, it is understood that light emissions having the respective energies occur. The light emission of each energy can be explained as follows as shown in FIG. 7(b). The light emission at 3.07 eV shows a light emission between the conduction band and the valence band. The light emission at 2.99 eV shows a light emission between a donor level $E_D1$ and the valence band. The light emission at 2.93 eV shows a light emission between a donor level $E_D2$ and the valence band. The light emission at 2.73 eV shows a light emission between the conduction band and an acceptor level $E_A1$. The light emission at 2.65 eV shows a light emission between the donor level $E_D1$ and the acceptor level $E_A1$. The light emission at 2.59 eV shows a light emission between the donor level $E_D2$ and the acceptor level $E_A1$. The light emission at 2.48 eV shows a light emission between the conduction band and an acceptor level $E_A2$. The light emission at 2.40 eV shows a light emission between the donor level $E_D1$ and the acceptor level $E_A2$. The light emission at 2.34 eV shows a light emission between the donor level $E_D2$ and the acceptor level $E_A2$. Thus, emissions different in energy occur and each impurity level can be clearly defined. This shows that the producing method of single crystal SiC according to this embodiment is superior in control of implantation positions of added impurities. That is, it shows that the conductivity of single crystal SiC can be easily controlled to either of p-type and n-type.

INDUSTRIAL APPLICABILITY

According to the present invention, local liquid phase epitaxial growth can be performed at a high temperature in the same environment as a conventional high-temperature heat treat environment such as the sublimation method. Therefore, micropipe defects contained in the seed crystal are not succeeded and closure of micropipe defects can be performed. In addition, because the growing surface is always in contact with Si melt, a state of an excess of Si is formed. Therefore, generation of defects caused by lack of Si can be suppressed. In addition, because the contact area of the used Si melt with the exterior is very small, mix of impurities in the growing surface can be suppressed. Thus, high-quality, high-performance single crystal SiC with high purity superior in crystallinity can be grown. Besides, because this growth method can realize growth at a very high temperature in comparison with the conventional LPE method, the growth rate can be remarkably improved in comparison with the conventional LPE method. This can make the growth efficiency of high-quality single crystal SiC very high. Further, there is no need of strict temperature gradient control upon single crystal growth, and it is possible to use a simple apparatus. From these, it can be promoted to put to practical use single crystal SiC that is superior in high temperature, high frequency, withstand voltage, and environmental resistance properties in comparison with any existing semiconductor material such as Si and GaAs, and expected as a semiconductor material for power devices and high-frequency devices.

The invention claimed is:

1. A silicon carbide single crystal, comprising:
   a terrace of more than 10 micrometer in width, and
   no fine grain boundaries of the threading screw dislocation type
   wherein
   the silicon carbide single crystal is epitaxial to a surface of an on-axis (0001) Si plane of a seed silicon carbide single crystal.

2. A method for the preparation of a single crystal silicon carbide bulk body comprising employing the single crystal silicon carbide according to claim 1 as a surface epitaxial growth layer of the single crystal silicon carbide bulk body.

3. The silicon carbide single crystal according to claim 1, further comprising a group III metal, wherein a p-type conductivity is obtained.

4. The silicon carbide single crystal according to claim 1, further comprising a group V element, wherein a n-type conductivity is obtained.

* * * * *